(12) United States Patent
van Kampen

(10) Patent No.: US 9,019,756 B2
(45) Date of Patent: Apr. 28, 2015

(54) ARCHITECTURE FOR DEVICE HAVING CANTILEVER ELECTRODE

(75) Inventor: Robertus Petrus van Kampen, 's-Hertogenbosch (NL)

(73) Assignee: Cavendish Kinetics, Ltd, San Jose, CA (US)

( * ) Notice: Subject to any disclaimer, the term of this patent is extended or adjusted under 35 U.S.C. 154(b) by 910 days.

(21) Appl. No.: 12/070,151

(22) Filed: Feb. 14, 2008

(65) Prior Publication Data

US 2009/0207717 A1 Aug. 20, 2009

(51) Int. Cl.
*G11C 11/50* (2006.01)
*H01H 59/00* (2006.01)
*G11C 23/00* (2006.01)

(52) U.S. Cl.
CPC ............ *H01H 59/0009* (2013.01); *G11C 11/50* (2013.01); *G11C 23/00* (2013.01)

(58) Field of Classification Search
USPC .......... 365/244, 151, 166, 164; 977/943, 742; 257/415, E51.04
See application file for complete search history.

(56) References Cited

U.S. PATENT DOCUMENTS

| | | | | |
|---|---|---|---|---|
| 6,054,745 A * | 4/2000 | Nakos et al. | .................. | 257/415 |
| 6,160,230 A * | 12/2000 | McMillan et al. | ............ | 200/181 |
| 6,469,603 B1 * | 10/2002 | Ruan et al. | ...................... | 335/78 |
| 6,625,047 B2 * | 9/2003 | Coleman, Jr. | ................... | 365/51 |
| 6,734,550 B2 * | 5/2004 | Martin et al. | .................. | 257/704 |
| 7,022,542 B2 * | 4/2006 | Combi et al. | ................... | 438/52 |
| 7,352,607 B2 * | 4/2008 | Furukawa et al. | ............ | 365/151 |
| 7,701,754 B1 * | 4/2010 | Parsa et al. | .................... | 365/151 |
| 7,952,041 B2 * | 5/2011 | Namose | ........................ | 200/181 |
| 7,998,775 B2 * | 8/2011 | Tsai et al. | ........................ | 438/52 |
| 2004/0175856 A1 * | 9/2004 | Jaiprakash et al. | ............. | 438/52 |
| 2004/0181630 A1 * | 9/2004 | Jaiprakash et al. | ........... | 711/127 |
| 2004/0240252 A1 * | 12/2004 | Pinkerton et al. | ............. | 365/151 |
| 2005/0062062 A1 * | 3/2005 | Bertin et al. | .................. | 257/200 |
| 2005/0104085 A1 * | 5/2005 | Pinkerton et al. | ............. | 257/183 |

(Continued)

FOREIGN PATENT DOCUMENTS

| | | |
|---|---|---|
| CN | 1419702 A | 5/2003 |
| CN | 1898150 A | 1/2007 |

(Continued)

OTHER PUBLICATIONS

Search report and written opinion for PCT/US2009/042336 dated Aug. 28, 2009.

(Continued)

*Primary Examiner* — Douglas King
(74) *Attorney, Agent, or Firm* — Patterson & Sheridan, LLP

(57) ABSTRACT

In one embodiment, a non-volatile memory bitcell includes a program electrode, an erase electrode, a cantilever electrode connected to a bi-stable cantilever positioned between the program electrode and the erase electrode, and switching means connected to the program electrode arranged to apply a voltage potential onto the program electrode, or to detect or to prevent the flow of current from the cantilever to the program electrode. The switching means may comprise a switch having a first node, a second node, and a control node, wherein voltage is applied to the control node to activate the switch to provide a connection between the first node and the second node. The switching means may comprise a pass-gate. The switching means may comprise an NMOS transistor. The switching means may comprise a PMOS transistor. The switching means may comprise a MEMS switch.

6 Claims, 6 Drawing Sheets

(56) References Cited

U.S. PATENT DOCUMENTS

| | | | |
|---|---|---|---|
| 2006/0061389 A1* | 3/2006 | Bertin | 326/104 |
| 2006/0139842 A1* | 6/2006 | Shim et al. | 361/160 |
| 2007/0004096 A1* | 1/2007 | Heuvelman | 438/127 |
| 2007/0018761 A1* | 1/2007 | Yamanaka et al. | 335/78 |
| 2007/0025138 A1 | 2/2007 | Furukawa et al. | |
| 2007/0132046 A1 | 6/2007 | Yoo et al. | |
| 2008/0137404 A1* | 6/2008 | Park | 365/164 |
| 2008/0144364 A1* | 6/2008 | Lee et al. | 365/164 |
| 2008/0308919 A1* | 12/2008 | Obata et al. | 257/678 |
| 2009/0115009 A1* | 5/2009 | Lee et al. | 257/415 |

FOREIGN PATENT DOCUMENTS

| | | |
|---|---|---|
| JP | 2007-502545 A | 2/2007 |
| JP | 2007-134678 A | 5/2007 |
| JP | 2007-516848 A | 6/2007 |
| WO | WO-2005/048296 A2 | 5/2005 |
| WO | WO-2005/061376 A1 | 7/2005 |
| WO | WO-2007/015097 | 2/2007 |
| WO | WO-2007/066133 | 6/2007 |
| WO | WO-2008032069 A1 | 3/2008 |

OTHER PUBLICATIONS

Search report and written opinion for PCT/IB2009/000256 mailed Jun. 3, 2009.
Office Action dated May 9, 2013 for Chinese Patent Application No. 200980107925.3.
European Office Action dated Feb. 23, 2011 for European Patent Application No. 09709757.0-2210.
Office Action dated Sep. 10, 2013 for Japanese Patent Application No. 2010-546414.
Office action dated Mar. 25, 2014 for Japanese Patent Application No. 2010-546414.

* cited by examiner

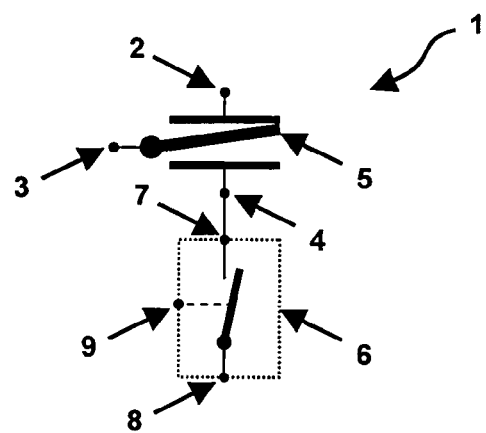
FIGURE 1
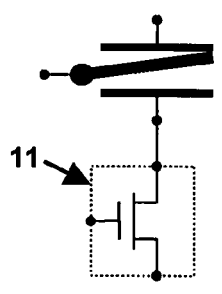 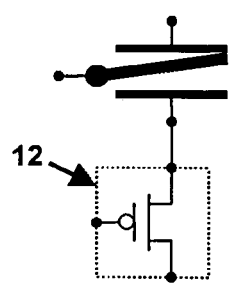 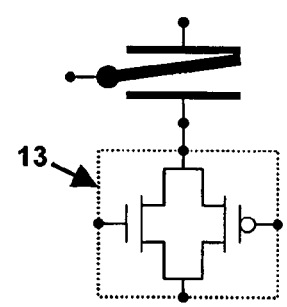 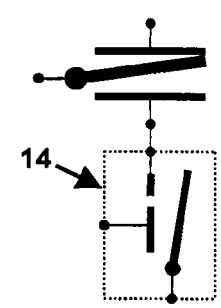
FIGURE 2a     FIGURE 2b     FIGURE 2c     FIGURE 2d

ARCHITECTURE FOR DEVICE HAVING CANTILEVER ELECTRODE

BACKGROUND

1. Field of Invention

The present invention relates to the field of multiple-time programmable memory bitcells and array architectures.

2. Description of Related Art

Typical non-volatile memory architectures used in such devices as Erasable Programmable Read-Only Memory (EPROM) are often complicated and need complex drive and power circuitry.

Multiple-Time Programmable (MTP) memory bitcells comprising bi-stable cantilevers have been developed in order to reduce the drive and power circuitry required by large arrays of non-volatile memory. The bi-stability of the cantilever design is achieved by employing adhesion forces at the contacting surfaces of the activation electrodes positioned at either side of the cantilever. Once the cantilever is in contact with either of these activation electrodes, it will remain in this position until these adhesion forces are overcome by electrostatic pulling forces from the activation electrode located on the opposite side of the cantilever, at which point the cantilever moves towards this pulling electrode until it contacts this electrode. Such devices have advantages when compared to traditional semiconductor-based memory cells in that they can operate as non-volatile memories without the need for supporting power supplies.

However, such devices also have disadvantages in that control of their programming can be complicated. Moreover, the switching speeds of these bi-stable cantilevers will depend on the voltage being applied between the cantilever and one of two activation electrodes. A higher voltage will create a larger electrostatic force, thereby urging the cantilever towards the activation terminal more rapidly. When the cantilever contacts the activation terminal, a current will pass from the cantilever to the activation electrode. Accordingly, if the voltage applied to the activation electrode is high, the resulting current may also be high.

High current bridging the cantilever and the activation electrode can cause damage to the cantilever and/or the activation electrode. In some circumstances, the current can weld these two elements together such that further movement and programming is not possible, thereby effectively destroying the memory bitcell.

Accordingly, there is a clear need for a simple three-terminal multiple-times programmable memory bitcell and array architecture which prevents excessive current transfer between the cantilever and the activation electrodes whilst ensuring reliable operation.

SUMMARY

In order to solve the problems associated with the related art, the present invention provides a 3-terminal MTP non-volatile memory bitcell which comprises: a program electrode; an erase electrode; a cantilever electrode connected to a bi-stable cantilever positioned between the program electrode and the erase electrode; and switching means connected to the program electrode arranged to apply a voltage potential onto the program electrode, or to detect or to prevent the flow of current from the cantilever to the program electrode.

The switching means may comprise a switch having a first node, a second node, and a control node, wherein voltage is applied to the control node to activate the switch to provide a connection between the first node and the second node. The switching means may comprise a transistor. The switching means may comprise an NMOS transistor. The switching means may comprise a PMOS transistor. The switching means may comprise a pass-gate. The switching means may comprise a MEMS switch.

The bi-stable cantilever, erase electrode and program electrode of the non-volatile memory bitcell of the present invention may be enclosed in a sealed cavity. In a sealed cavity environment, the surfaces of the bi-stable cantilever, the erase electrode, and the program electrode are protected from outside potentially degrading environmental effects.

The present invention further provides a method of programming the above non-volatile memory bitcell. The method comprises the steps of: substantially reducing the potential difference between the cantilever electrode and the erase electrode; applying a potential difference between the cantilever and one side of the switching means; temporarily turning on the switching means to create a potential difference between the cantilever and the program electrode wherein the potential difference is sufficient to enable the cantilever to contact the program electrode; and turning off the switching means before the cantilever makes contact with the program electrode.

The present invention further provides a method of determining whether the above non-volatile memory bitcell is in a programmed state, the method comprises the steps of: applying a potential difference between the cantilever and one side of the switching means; temporarily turning on the switching means to create a potential difference between the cantilever and the program electrode; and sensing the current flowing, if any, through the switching means in order to determine if the cantilever is in contact with the program electrode.

The present invention further provides a method of erasing the above non-volatile memory bitcell, the method comprises the steps of: substantially reducing the potential difference between the cantilever electrode and the program electrode; and applying a potential difference between the cantilever and the erase electrode wherein the potential difference is sufficient to enable the cantilever to contact the erase electrode.

The present invention further provides a memory array comprising at least one non-volatile memory bitcell, as defined above.

As will be appreciated, the present invention provides several advantages over the related art. For example, the bitcell of the present invention results in an array that is simpler, smaller and less expensive to manufacture than related art arrays.

Important technical advantages of the present invention are readily apparent to one skilled in the art from the following figures, descriptions, and claims.

BRIEF DESCRIPTION OF DRAWINGS

For a more complete understanding of the present invention and for further features and advantages, reference is now made to the following description taken in conjunction with the accompanying drawings.

FIG. 1 represents a schematic view of a 3-terminal MTP memory bitcell wherein the switching means comprises a switch, according to an embodiment of the invention.

FIG. 2a represents a schematic view of a 3-terminal MTP memory bitcell wherein the switching means comprises an NMOS transistor, according to an embodiment of the invention.

FIG. 2b represents a schematic view of a 3-terminal MTP memory bitcell wherein the switching means comprises a PMOS transistor, according to an embodiment of the invention.

FIG. 2c represents a schematic view of a 3-terminal MTP memory bitcell wherein the switching means comprises a pass-gate.

FIG. 2d represents a schematic view of a 3-terminal MTP memory bitcell wherein the switching means comprises a MEMS switch.

DETAILED DESCRIPTION

Figure 3:
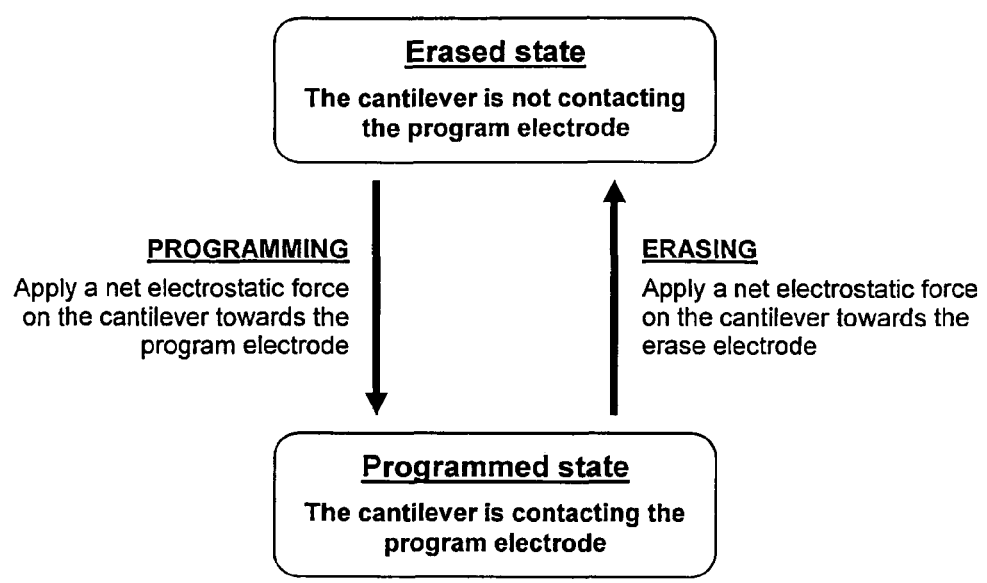
FIG. 3 represents an MTP state diagram, according to an embodiment of the invention.

With reference to FIG. 1, one embodiment of the present invention will now be described. The three-terminal multiple times programmable memory bitcell 1 of the present invention comprises an erase electrode 2, a program electrode 4, a cantilever electrode 3 connected to a movable cantilever 5 situated between the erase electrode 2 and the program electrode 4, and switching means 6 is connected to the program electrode 4. The switching means 6 comprises a switch having a first node 7, a second node 8, and a control node 9, wherein voltage is applied to the control node to activate the switch to provide a connection between the first node and the second node. The first node 7 is connected to the program electrode 4.

The erase electrode 2, program electrode 4, cantilever electrode 3, and the cantilever 5 are made of a suitable electrically conductive material. The contacting areas of the cantilever 5 and the program electrode 4 are electrically conductive which allows the transfer of electrical charge from the cantilever 5 to the program electrode 4, or vice versa. The contacting areas of the cantilever 5 and the erase electrode 2 are electrically insulated, or only the contact area of the erase electrode is electrically insulated, or only the area of the cantilever which comes into contact with the erase electrode is electrically insulated in order to prevent electrical charge from being transferred from the cantilever 5 to the erase electrode 2, or vice versa.

The cantilever 5 can be moved from a position where it is in contact with the program electrode 4 to a position where it is in contact with the erase electrode 2. When the cantilever 5 is in contact with either the erase electrode 2 or the program electrode 4, it is held in place by adhesion forces. In order to overcome these mechanical forces, electrostatic forces are generated by applying specific voltages to the erase electrode 2, program electrode 4 and cantilever electrode 3.

Now, with reference to FIGS. 2a,b,c,& d, several embodiments of the 3-terminal MTP memory bitcell will be described. The switching means in the bitcells of FIG. 2a,b, c,& d have been implemented using an NMOS transistor 11, a PMOS transistor 12, a pass-gate 13, and a MEMS switch 14 respectively.

When using NMOS transistor 11 (FIG. 2a), PMOS transistor 12 (FIG. 2b) or pass-gate 13 (FIG. 2c) as switching means, the source/drain junctions of these transistors will function as said first and second nodes of the switching means and the gate of these transistors will function as said control node of the switching means. Furthermore, when using PMOS transistors, the polarity of the control signal on the gate must be reversed compared to the polarity of the control signal for the NMOS transistors. Similarly, when using pass-gate 13 as switching means, two control signals of opposite polarity must be applied to the gates of the NMOS and PMOS transistors.

When using a MEMS switch 14 (FIG. 2d) as switching means, the cantilever connection will function as said second node of the switching means, the contact electrode upon which the cantilever will land when programmed will function as the first node of the switching means, and the pull-in electrode which is used to activate the switch will function as the control node of the switching means.

Now, with reference to FIGS. 1 and 3, the operation of the bitcell 1 of FIG. 1 will now be described. In operation, the bitcell 1 of FIG. 1 has two distinct states. The first state is a programmed state. The bitcell 1 is said to be in the programmed state when the cantilever 5 is contacting the program electrode 4. This state is achieved by applying a potential difference (typically in the range of 1V to 20V, either positive or negative) between the cantilever electrode 3 and the program electrode 4. Furthermore the potential difference between the cantilever electrode 3 and the erase electrode 2 is substantially reduced in order to minimize the electrostatic force pulling the cantilever 5 towards the erase electrode 2. Application of these specific voltages results in the generation of a net electrostatic force which pulls the cantilever 5 towards the program electrode 4.

If the cantilever 5 contacts the program electrode 4, the potential difference between the cantilever electrode 3 and the program electrode 4 reduces to zero because the contacting surfaces are electrically conductive. This will cause the electrostatic force pulling the cantilever 5 towards the program electrode 4 to subside.

However, a problem may occur when the cantilever 5 comes into contact with the program electrode 4. Upon contact, a large current may flow through the cantilever 5 and the contacting areas. The excessive current can damage the cantilever 5 and/or the contact areas of the program electrode 4. In order to avoid this excessive charge transfer, the potential difference between the cantilever electrode 3 and the program electrode 4 must be removed before contact between the cantilever 5 and the contact region of the program electrode 4 is made. However, if this potential difference is removed too soon, the cantilever 5 will not have developed enough momentum for it to reach the contact area of the program electrode 4, thereby resulting in a programming failure of the device. As will be explained below, this problem has been overcome by the architecture of the present invention.

The second state of the bitcell 1 is an erased state. The bitcell 1 is said to be in the erased state when the cantilever is not contacting the program electrode 4. Preferably, the erased state is achieved by having the cantilever 5 being held in place against the erase electrode 2. This state is achieved by applying a potential difference (typically in the range of 1V to 20V, either positive or negative) between the cantilever electrode 3 and the erase electrode 2. Furthermore the potential difference between the cantilever electrode 3 and the program electrode 4 is substantially reduced in order to minimize the electrostatic force pulling the cantilever 5 towards the program electrode 4. Application of these specific voltages results in the generation of a net electrostatic force which pulls the cantilever 5 towards the erase electrode 2.

Because the contacting areas of the cantilever 5 and the erase electrode 2 are electrically non-conductive, the erase voltage will not need to be removed before the cantilever 5 contacts the erase electrode 2. Accordingly, the timing of the erase signal will be less critical than that of the programming signal. As will be appreciated, a similar control of the timing of the erase signal is required as for the programming voltage if the contacting areas of the cantilever 5 and the erase electrode 2 are electrically conductive. In that case also the potential difference between the cantilever electrode 3 and the erase electrode 2 needs to be removed before the cantilever 5 contacts the erase electrode 2.

Figure 4:
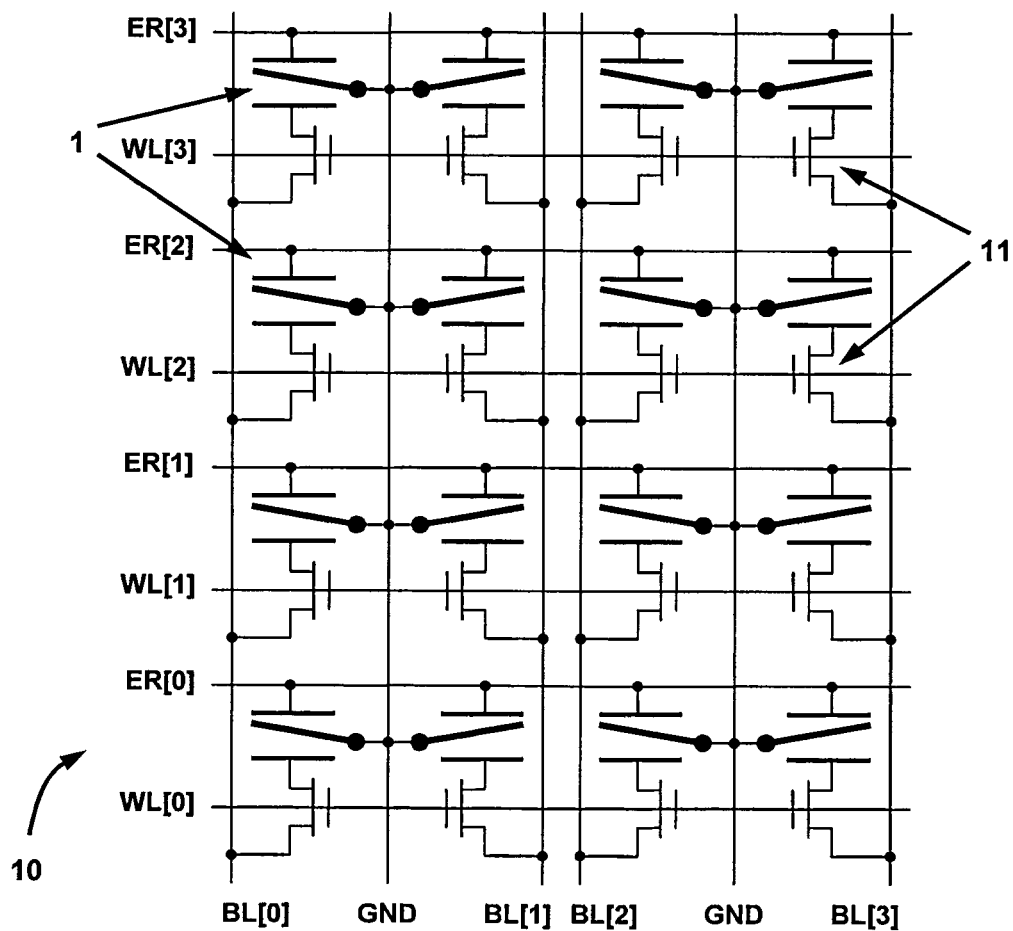
FIG. 4 represents a schematic view of a 3-terminal MTP memory array architecture, according to an embodiment of the invention.

Now, with reference to FIG. 4, the architecture of a memory array in accordance with the present invention will now be described. As can be seen from FIG. 4, a plurality of memory bitcells 1, as described in reference to FIGS. 1, 2 and 3, are arranged in a bitcell array 10. In this particular embodiment, NMOS transistors 11 have been used as switching means in the MTP bitcells. Each erase electrode 2 of each bitcell 1 in a row of the array 10 is connected to the same eraseline (i.e. ER[0] to ER[3]). Also, each program electrode 4 of each bitcell 1 of the array 10 is connected to one side of an NMOS transistor 11 (i.e. either the source or the drain). The other side of all the transistors 11 (i.e. the drain or the source) in a column of the array 10 are connected to the same bitline (i.e. BL[0] to BL[3]). The gate of each transistor 11 in a row of the array 10 is connected to the same wordline (i.e. WL[0] to WL[3]). Finally, the cantilever electrode 3 of every bitcell 1 in the array 10 is connected to a ground potential.

As will be appreciated, if any of the alternative bitcell embodiments of FIG. 2 are used in the memory array, the polarity of the control signals WL[0] to WL[3] may need to be reversed. Also, although the memory array shown in FIG. 3 is a 4×4 array, it will be appreciated that the array may be of any suitable size.

The detailed descriptions of FIGS. 5, 6, 7 and 8 below describe the control signals required to operate (read, write, erase) the memory array shown in FIG. 4. If any of the alternative bitcell embodiments of FIG. 2 are used in the array, the polarity of the control signals may need to be reversed.

Figure 5:
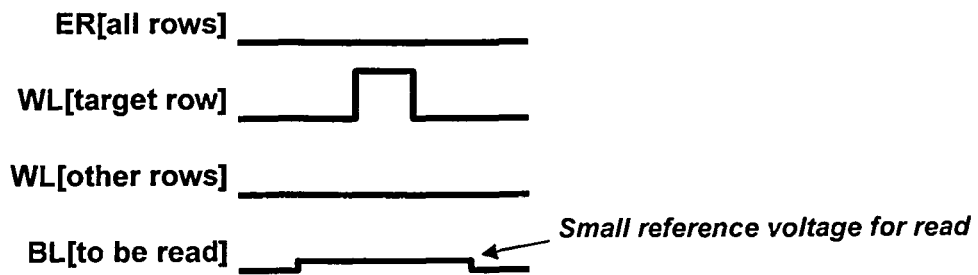
FIG. 5 represents a timing diagram for the read cycle of 3-terminal MTP memory array architecture, according to an embodiment of the invention.

Now, with reference to FIGS. 4 and 5, the read operation of an array in accordance with the present invention will now be described. The state of any specific bitcell 1 in the array can be determined by applying a reference voltage to the bitline and sensing the resulting current flowing into the bitline.

During the read operation, the eraseline of each row will be set to a potential close to the ground potential, thereby eliminating the possibility of accidentally erasing any bitcell 1. When a target bitcell 1 is to be read, a small reference voltage is applied to the bitline associated with the specific bitcell 1. Then, the wordline of the row associated with the target bitcell 1 is momentarily set to a sufficiently high potential to turn on the NMOS transistors 11 associated with the target row, while the wordlines of every other row of the array 10 are kept at a potential close to the ground potential to ensure that these transistors 11 remain turned off.

During the period when the transistors 11 of the target row are turned on, the current flowing through the target bitcell 1 and the associated transistor 11 into the bitline will be sensed using a sense-amp (not shown), or other suitable means for sensing the current. If the cantilever 5 is not contacting the program electrode 4 (i.e. the memory bitcell 1 is in an erased state), no current will pass through the transistor 11 and, therefore, no current will be sensed by the sense-amp. Conversely, if the cantilever 5 is contacting the program electrode 4 (i.e. the memory bitcell 1 is in a programmed state), a current (typically in the range of 10 nA to 10 mA) will be sensed by the sense-amp.

During the read operation, a portion of the reference voltage is applied to the program electrode 4 of the bitcell 1. If the bitcell 1 being read is in the erased state, there is a very small electrostatic force acting on the cantilever 5 which will pull it towards the program electrode 4. It is therefore important that the reference voltage applied to the bitline 1 during the read operation be small enough not to create an electrostatic force capable of moving the cantilever 5 in contact with the program electrode 4. Preferably, the reference voltage is in the range of 50 mV to 1V. At the same time this small reference voltage limits the current that can flow through the cantilever 5 and contact area of the program electrode 4.

Figure 6:
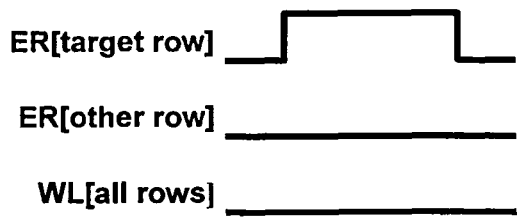
FIG. 6 represents a timing diagram for the erase cycle of a 3-terminal MTP memory array architecture, according to an embodiment of the invention.

Now, with reference to FIG. 6, the erase operation in accordance with the present invention will now be described. As explained above, the cantilevers 5 of the array 10 are at ground potential. In order to erase a target row of the array, a sufficiently high potential (the erase voltage) is applied to the eraseline of the target row, while the potential of the eraselines of the remaining rows of the array 10 are kept at a potential close to the ground potential.

The target row will typically comprise programmed and erased bitcells 1. As explained above, the bitcells 1 which are in the programmed state will have cantilevers 5 which are touching their respective program electrodes 4. When the erase voltage is applied to the erase electrode 2 of the target row, the cantilevers 5 in the target row will experience a net electrostatic force which will move them towards the erase electrode 2. Accordingly, these bitcells 1 in the target row will become erased. Similarly, for bitcells 1 in the target row which are already in the erased state, the resulting net electrostatic force will simply pull the cantilevers 5 tighter against the erase electrode and these bitcells will remain in the erased state.

Bitcells 1 in non-targeted rows will have their erase electrodes 2 at a potential close to the ground potential (the same potential as the cantilevers 5). Accordingly, there will be no net electrostatic forces acting on the cantilevers 5 and these will remain in their programmed or erased states.

Now, with reference to FIG. 7, the write operation in accordance with the present invention will now be described. During the write procedure, a sufficiently high potential (the programming voltage) is applied to the bitline associated with the target bitcell 1 to be programmed. The transistor 11 associated with the target bitcell 1 is turned on by applying a sufficiently high potential to the wordline of the associated target bitcell 1. This will result in the programming voltage to be applied to the program electrode of the target bitcell 1. Multiple bitcells 1 in the same row as the target row can be programmed at the same time by applying the programming voltage to the appropriate bitlines. The programming voltage must not be applied to an already programmed memory bitcell, as the resulting current can damage the cantilever 5 and the contact area of the program electrode 4. Therefore the logic state of the bitcell must be known before writing. Alternatively, the bitcells 1 can undergo an erase operation before each write operation, similar to Electrically Erasable Programmable Read Only Memories (EEPROMs) or FLASH memories.

When a cantilever 5 in a bitcell 1 is being programmed, a high current through the cantilever 5 and the contact area of the program electrode 4 must be avoided in order to preserve the integrity of the cantilever 5 and the program electrode 4. This is achieved by turning off the transistor 11 before the cantilever makes contact with the program electrode 4.

Figure 7:
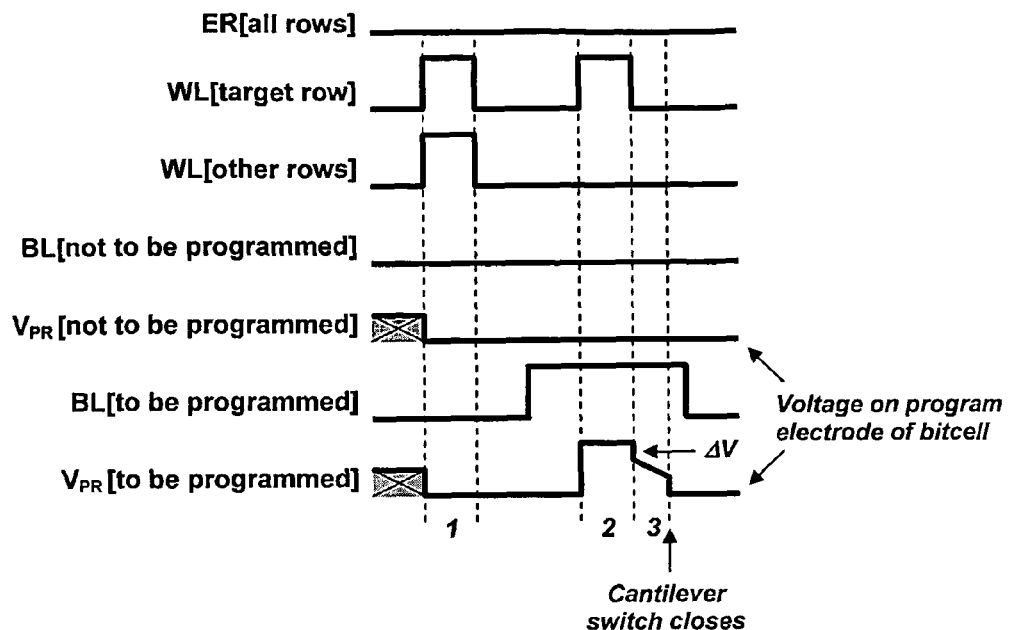
FIG. 7 represents a timing diagram for the write cycle of a 3-terminal MTP memory array architecture, according to an embodiment of the invention.

The timing of the various signals in the array during a programming operation is shown in FIG. 7. All eraselines of the array 10 are kept at a potential close to the ground potential to avoid erasing any of the bitcells 1. At the start of the write cycle, the voltages on the program electrodes 4 of all bitcells 1 can be reset to a potential close to the ground potential, indicated by period 1 in FIG. 7. This is achieved by setting the potential on the bitlines close to the ground potential before the transistors 11 are turned on by applying a sufficiently high voltage to the wordlines of the array 10. After the voltages on the program electrodes 4 have been reset, the transistors are turned off by applying a potential close to the ground potential to the wordlines of the array 10. This step ensures that all electrodes (program, erase and cantilever) of the bitcells 1 are at the same potential which avoids accidental programming of any bitcell. This period is optional and may not be required.

In a next step, the programming voltage is applied to the bitlines associated with the bitcells 1 in the target row to be programmed. Then, the transistors of the target row are turned on by applying a sufficiently high voltage to the associated wordline. This step is shown as period 2 in FIG. 7 and will result in the programming voltage to be applied to the program electrodes 4 of the target bitcells 1. Therefore, the cantilevers 5 of the target bitcells 1 are subjected to an electrostatic force which will pull the cantilevers 5 off the erase electrodes 2 and move them towards the program electrodes 4.

Before the cantilevers 5 make contact with the program electrodes 4, the transistors 11 of the target row must be turned off by applying a potential close to the ground potential to the associated wordline. This step is shown as period 3 in FIG. 7. Because the cantilevers 5 have built up momentum, they will continue to move towards the program electrodes 4 until they come into contact with the program electrodes 4. At this point, because the associated transistors 11 are off, no DC current flows through the cantilevers 5 or the contact area of the program electrodes 4. In addition to the momentum which has been built up by the cantilevers 5, a further electrostatic force will be pulling the cantilevers 5 towards the program electrodes 4. This electrostatic force is due to the residual voltage on the program electrodes 4.

When the transistor 11 is shut off at the end of period 2 in FIG. 7, the voltage on the program electrode 4 of the target bitcell 1 initially will be reduced by the amount $\Delta V$ because of charge injection. The total charge Q stored on the capacitance of the program electrode 4 when the transistor 11 is just shut off at the beginning of period 3 in FIG. 7 can be shown to be:

$$Q = (C_{CANT0} + C_{JUNCTION0}) * (V_{PROGRAM} - \Delta V)$$

Where $C_{CANT0}$ is the capacitance between the cantilever 5 and the program electrode 4 at the beginning of period 3 in FIG. 7, $C_{JUNCTION0}$ is the junction capacitance of the transistor 11 at the beginning of period 3 in FIG. 7 and $V_{PROGRAM}$ is the initial programming voltage applied to the program electrode 4 during period 2 in FIG. 7. As the cantilever 5 continues to move towards the program electrode 4, the capacitance between the cantilever 5 and the program electrode 4 increases. Because the transistor 11 is shut off, no charge can leak through the transistor 11 and the voltage $V_{PR}$ on the program electrode 4 will be reduced to:

$$V_{PR} = ((C_{CANT0} + C_{JUNCTION0}) / (C_{CANT1} + C_{JUNCTION1})) * (V_{PROGRAM} - \Delta V)$$

Where $C_{CANT1}$ is the increasing capacitance between the cantilever 5 and the program electrode 4 as the cantilever moves towards the program electrode 4 and $C_{JUNCTION1}$ is the junction capacitance of the transistors during period 3. Since $C_{CANT1}$ increases during period 3, the voltage on the programming electrode decreases during this period. The decreasing voltage on the programming electrode also results in an increase of the junction capacitance $C_{JUNCTION1}$ of the transistor 11, thereby further reducing the voltage $V_{PR}$ on the programming electrode. Accordingly, the voltage $V_{PR}$ on the program electrode 4 will continue to generate an electrostatic force during period 3 in FIG. 7 which will act on the cantilever to further move it towards the program electrode 4.

When the cantilever finally contacts the program electrode 4 at the end of period 3 in FIG. 7, the remaining voltage quickly drops to zero, as the capacitances are discharged through the cantilever 5 and the contact region of the program electrode 4.

The bitlines associated with the bitcells 1 in the target row that should not be programmed are kept at a potential close to the ground potential. This ensures that the program electrodes 4 of these bitcells are close to the ground potential when the transistors 11 of the target row are turned on. Hence, there will be a minimal or no electrostatic force acting on the cantilevers of these bitcells and these will remain in their current state.

At the same time, the memory bitcells 1 in the same column as the selected bitcell 1 need to have their program electrodes set to a potential close to the ground potential so as to avoid being programmed. This is achieved by ensuring that all wordlines not associated with the target row are kept at a potential close to the ground potential. This will result in the transistors 11 of the non-targeted rows to remain turned off. The isolation of these transistors 11 must be sufficient to avoid charging the program electrodes 4 through the turned-off transistor during the time that the programming voltage is applied to the associated bitline.

Figure 8:
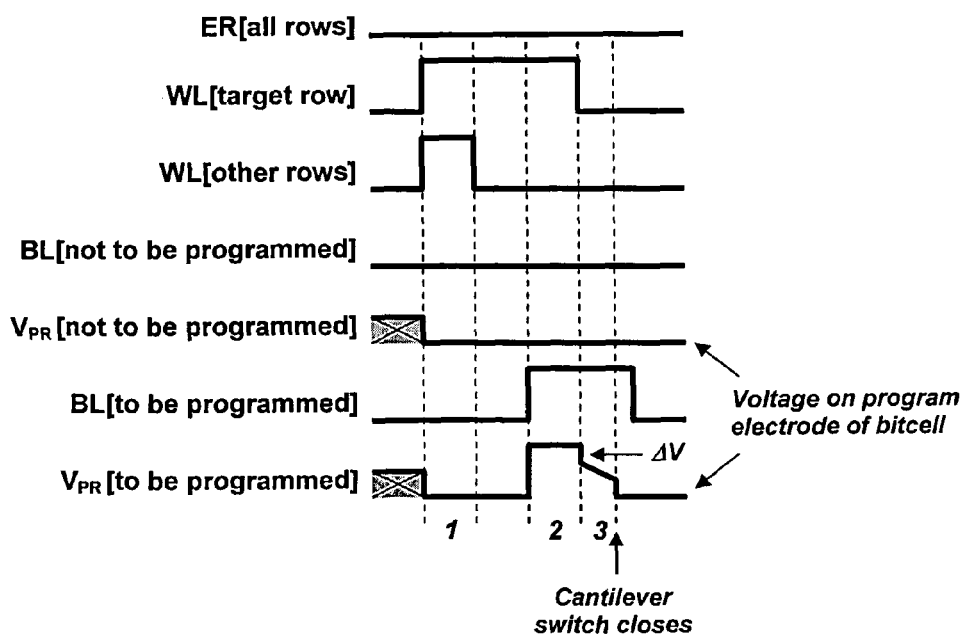
FIG. 8 represents an alternative timing diagram for a write cycle of a 3-terminal MTP memory array architecture, according to an embodiment of the invention.

Now, with reference to FIG. 8, an alternative write operation in accordance with the present invention will now be described. All eraselines of the array 10 are kept at a potential close to the ground potential to avoid erasing any of the bitcells 1. At the start of the write cycle, the voltages on the program electrodes 4 of all bitcells 1 can be reset to a potential close to the ground potential, indicated by period 1 in FIG. 8. This is achieved by setting the potential on the bitlines close to the ground potential before the transistors 11 are turned on by applying a sufficiently high voltage to the wordlines of the array 10. After the voltages on the program electrodes 4 are reset, only the transistors of the not-targeted rows are turned off by applying a potential close to the ground potential to the associated wordlines of the array 10. This step ensures that all electrodes (program, erase and cantilever) of the bitcells are at the same potential and avoids accidental programming of any bitcell. This period is optional and may not be required for the non-targeted rows.

In a next step, the programming voltage is applied to the bitlines associated with the bitcells 1 in the target row to be programmed. Since the transistors 11 associated with the target row are still turned on from period 1, the programming voltage is immediately applied to the program electrodes 4 of the target bitcells 1. This step is shown as a period 2 in FIG. 8. Therefore, the cantilevers 5 of the target bitcells 1 are immediately subjected to an electrostatic force which will pull these cantilevers 5 off the erase electrodes 2 and move them towards the program electrodes 4.

Before the cantilevers 5 make contact with the program electrodes 4, the transistors 11 of the target row must be turned off by applying a potential close to the ground potential to the associated wordline. This step is shown as period 3 in FIG. 8. Because the cantilevers 5 have built up momentum and a further electrostatic force is still pulling on the cantilevers as described above, the cantilevers will continue to move towards the program electrodes 4 until they come into contact with the program electrodes 4. At this point, because the associated transistors 11 are off, no DC current can flow through the cantilevers 5 or the contact area of the program electrodes 4.

Figure 9:
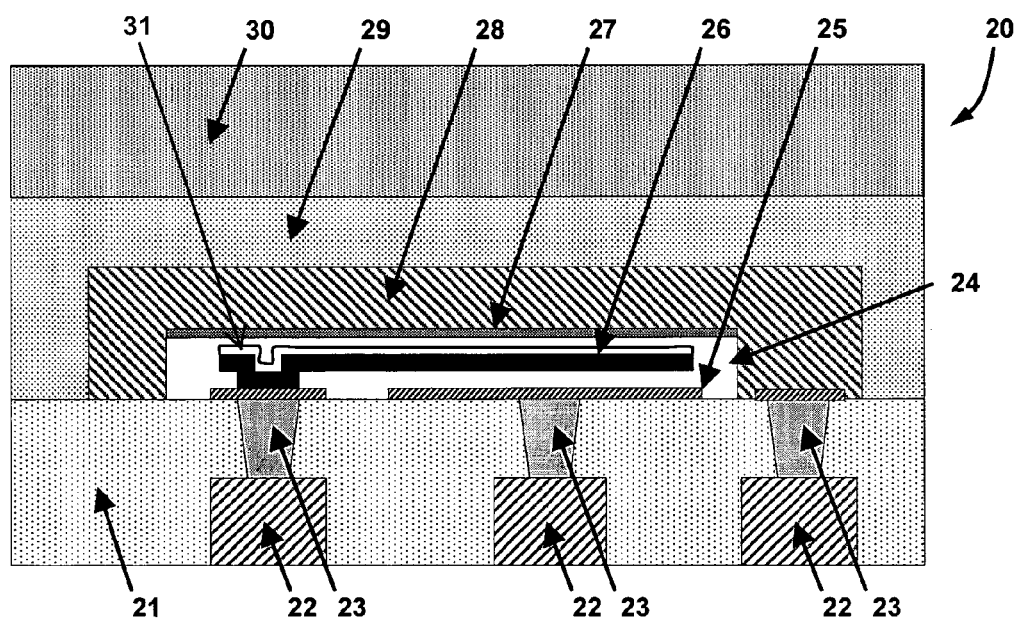
FIG. 9 represents a cross-section view of the bi-stable cantilever, erase electrode, and program electrode elements of a 3-terminal MTP memory bitcell structure enclosed in a sealed cavity that is integrated into the back-end-of-line of a CMOS process, according to an embodiment of the invention.

Now, with reference to FIG. 9, a cross-section view of the bi-stable cantilever 26, erase electrode 28, and program electrode 25 elements of a 3-terminal MTP memory bitcell structure enclosed in a sealed cavity 24 that is integrated into the back-end-of-line of a CMOS process, according to an embodiment of the invention. In this particular embodiment an electrically insulating layer 27 is positioned at the bottom surface of the erase electrode 28, such that when cantilever 26 is in the erased-state it will touch this insulating layer 27 and current is prevented from flowing from the cantilever 26 to the erase electrode 28. Other variations are possible to prevent such current from flowing in the erased-state, e.g. the top-surface of a portion of the top-surface of the cantilever 26 can have an electrically insulating layer 31 or a small portion underneath the erase electrode 28 can have an electrically insulating layer or a combination thereof.

The cantilever 26 is free to move in the cavity 24 between the program electrode 25 and the insulating layer 27 underneath the erase electrode 28, depending on the voltages applied to the cantilever 26, program electrode 25 and erase electrode 28 via the underlying metallization structures 22 and connecting vias 23. These connecting vias 23, the metallization structures 22 which are embedded in inter-metal dielectric 21, as well as the metallization structures 28 (which also serve as erase electrode) which are embedded in inter-metal dielectric 29 are part of the standard CMOS back-end-of-line process. Also shown in FIG. 9 is the top passivation layer 30, which can consist of a combination of silicon-dioxide and silicon-nitride layers. This passivation layer 30 serves to protect the underlying elements from various outside potentially degrading environmental effects.

Inter-metal dielectric layer 29 and passivation layer 30 also serve as seal layers for the cavity 24 in which the cantilever 25 resides. In a sealed cavity environment, the surfaces of the bi-stable cantilever, the erase electrode, and the program electrode are protected from outside potentially degrading environmental effects.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A device, comprising:
    a first inter-metal dielectric layer having metallization structures formed therein;
    a first electrode disposed over the metallization structures;
    a second electrode disposed over the first electrode and coupled to the metallization structures through connecting vias;
    an insulating layer disposed on the second electrode; and
    a cantilever electrode connected to a cantilever positioned between the second electrode and the first electrode within a cavity, wherein the insulating layer is disposed between the cantilever and the second electrode, wherein the cantilever is movable between the first electrode and the insulating layer, and wherein the second electrode borders the cavity on at least one side perpendicular to the insulating layer.

2. The device of claim 1, further comprising an electrically insulated layer disposed on the cantilever.

3. The device of claim 1, wherein the cavity is sealed and integrated into the back-end-of-line of a CMOS process.

4. The device of claim 1, further comprising a second inter-metal dielectric layer disposed over the second electrode and sealing the cavity.

5. The device of claim 4, further comprising a passivation layer disposed over the second inter-metal dielectric layer.

6. The device of claim 5, wherein the passivation layer comprises a material selected from the group consisting of silicon dioxide and silicon nitride.

\* \* \* \* \*